(12) United States Patent
Hsieh

(10) Patent No.: US 8,460,956 B2
(45) Date of Patent: Jun. 11, 2013

(54) METHOD FOR FABRICATING A THIN FILM TRANSISTOR SUBSTRATE

(76) Inventor: Incha Hsieh, Hsinchu County (TW)

( * ) Notice: Subject to any disclaimer, the term of this patent is extended or adjusted under 35 U.S.C. 154(b) by 120 days.

(21) Appl. No.: 13/233,594

(22) Filed: Sep. 15, 2011

(65) Prior Publication Data

US 2012/0070946 A1    Mar. 22, 2012

(30) Foreign Application Priority Data

Sep. 21, 2010   (TW) ............................... 99132031 A

(51) Int. Cl.
*H01L 21/00*  (2006.01)

(52) U.S. Cl.
USPC ......... 438/34; 257/E21.411; 438/164; 216/12

(58) Field of Classification Search
USPC   438/34, 164; 257/E21.411, E33.062; 349/43; 216/12

See application file for complete search history.

(56) References Cited

U.S. PATENT DOCUMENTS

2006/0289965 A1 *  12/2006  Park et al. ..................... 257/590

* cited by examiner

*Primary Examiner* — Caridad Everhart

(57) ABSTRACT

A method for fabricating a thin film transistor substrate includes: (a) forming a gate electrode on a substrate using a first photoresist layer; (b) forming an insulating film, an active semiconductor layer, a doped semiconductor layer, an ohmic contact metal film, a passivation film, and a second photoresist layer on the substrate to cover the gate electrode; (c) disposing a multi-tone mask over the second photoresist layer, followed by performing a lithography process to form the second photoresist layer into a patterned photoresist, which has different thicknesses at a location corresponding in position to the gate electrode and on two opposite sides of the location; and (d) performing etching using the patterned photoresist.

19 Claims, 17 Drawing Sheets

METHOD FOR FABRICATING A THIN FILM TRANSISTOR SUBSTRATE

CROSS-REFERENCE TO RELATED APPLICATION

This application claims priority of Taiwanese application no. 099132031, filed on Sep. 21, 2010.

BACKGROUND OF THE INVENTION

1. Field of the Invention

This invention relates to a method for fabricating a semiconductor component, more particularly to a method for fabricating a thin film transistor substrate.

2. Description of the Related Art

Referring to FIG. 1, a thin film transistor substrate (TFT substrate), which is one of the most important elements in a liquid crystal display, includes a transparent glass substrate 11, and a plurality of pixel units 12 regularly arranged on the substrate 11. Each of the pixel units 12 includes a thin film transistor structure (TFT structure) 18, a storage capacitor ($C_{st}$) 19 spaced apart from the TFT structure IS, and a pixel electrode layer 17 electrically connecting the TFT structure 18 to the storage capacitor 19. The storage capacitor 19, based on the location thereof in the TFT substrate, can be classified as a Cs-on-gate structure or a Cs-on-common structure. In FIG. 1, the Cs-on-gate structure is used as an example for illustration.

FIG. 2 is a fragmentary cross-sectional view taken along line A-A in FIG. 1, and FIG. 3(a) or 3(b) is a fragmentary cross-sectional view taken alone line B-B in FIG. 1.

Referring to FIG. 2, the TFT structure 18 includes: a gate electrode 182 formed on the substrate 11, an insulating film 183 covering the substrate 11 and the gate electrode 182, an active semiconductor layer 184a formed on the insulating film 183, a doped semiconductor layer 184b formed on the active semiconductor layer 184a and interrupted by a channel 184e, source and drain electrodes 185a, 185b formed on the doped semiconductor layer 184b and located respectively at two opposite sides of the channel 184e, and a passivation film 186 covering the source and drain electrodes 185a, 185b. The passivation film 186 is formed with two contact holes 185c, through which the source and drain electrodes 185a, 185b are partially exposed.

The storage capacitor 19 has a metal-insulator-semiconductor (MIS) structure as shown in FIG. 3(a), or a metal-insulator-metal (MIM) structure as shown in FIG. 3(b). As shown in FIG. 3(a), the MIS structure of the storage capacitor 19 includes: a lower capacitor electrode 192 formed on the substrate 11, an insulating film 193 covering the lower capacitor electrode 192 and the substrate 11, an active semiconductor layer 194a formed on the insulating film 193, a doped semiconductor layer 194b formed on the active semiconductor layer 194a, an upper capacitor electrode 195 formed on the doped semiconductor layer 194b, and a conductive layer 196 that is formed on the upper capacitor electrode 195 and that is a portion of the pixel electrode layer 17.

As shown in FIG. 3 (b), the MIM structure of the storage capacitor 19 includes: a lower capacitor electrode 192 formed on the substrate 11, an insulating film 193 covering the lower capacitor electrode 192 and the substrate 11, and a conductive layer 196 that is formed on the insulating film 193 and that is a portion of the pixel electrode layer 17.

The pixel electrode layer 17 covers predetermined regions of the TFT structure 18 and the storage capacitor 19 so that the TFT structure 18 and the storage capacitor 19 are electrically connected to each other through the pixel electrode layer 17.

Referring to FIG. 4, a method for fabricating the TFT substrate shown in FIG. 1 involves a five-photomask process, and includes a gate electrode forming step 101, a semiconductor forming step 102, a source/drain electrode forming step 103, a contact hole forming step 104, and a pixel electrode layer forming step 105.

Referring to FIG. 5, in step 101, a metal layer 12a and a photoresist layer 200 made of a positive-type photoresist material are sequentially formed on the substrate 11, and a lithography process is conducted using a gate mask (M1) to form the first metal layer 12a into the gate electrode 182.

Referring to FIG. 6, in step 102, the insulating film 183, the active semiconductor layer 184a, the doped semiconductor layer 184b, and a photoresist layer 200 are sequentially formed on the substrate 11 to cover the gate electrode 182, and a lithography process is conducted using an active mask (M2) to form a patterned photoresist A portion of each of the doped semiconductor layer 184b, the active semiconductor layer 184a, and the insulating film 183, which is uncovered by the patterned photoresist, is removed.

Referring to FIG. 7, in step 103, an ohmic contact metal film 15 and a photoresist layer 200 are sequentially formed on the doped semiconductor layer 184b, and a lithography process is conducted using a source/drain mask (S/D mask, M3) so that the channel 184e is formed to expose the active semiconductor layer 184a at a location corresponding to the gate electrode 182, and so that the ohmic contact metal layer 15 is formed into the source and drain electrodes 185a, 185b at two opposite sides of the channel 184e.

Referring to FIG. 8, in step 104, the passivation film 186 is formed to cover the source and drain electrodes 185a, 185b, and the exposed active semiconductor layer 184a, and a photoresist layer 200 is formed on the passivation film 186. A lithography process is conducted using a contact-hole mask (M4) so that the two contact holes 185c are formed by removing two portions of the passivation film 186 on the two opposite sides of the channel 184e to partially expose the source and drain electrodes 185a, 185b.

Referring to FIG. 9, in step 105, a transparent conductive layer 17a is formed on the passivation film 186 and the exposed parts of the source and drain electrodes 185a, 185b. A lithography process is conducted using a pixel mask (M5) so that the transparent conductive layer 17a is patterned to form the pixel layer 17. Accordingly, the TFT structure 18 as shown in FIG. 2 is obtained.

On the other hand, the storage capacitor 19 can also be obtained while forming the TFT structure 18, and the procedures for forming the storage capacitor 19 are well-known in the relevant art. Therefore, detailed descriptions thereof are omitted herein for the sake of brevity.

In order to reduce equipment costs, four-photomask and three-photomask processes are also proposed nowadays. In such processes, a multi-tone mask, which further has a partially transparent region having a transmittance between a fully transparent region and a non-transparent region, is used to replace a normal mask (i.e., a single-tone mask only including the fully transparent region and the non-transparent region), such as the gate mask (M1), the active mask (M2), the S/D mask (M3), the contact-hole mask (M4) or the pixel mask (M5). For example, in the four-photomask process, a multi-tone mask is used to replace the active mask (M2) and the S/D mask (M3) when conducting steps 102 and 103. In the three-photomask process, two multi-tone masks are used, one of which is used to replace the active mask (M2) and the S/D mask (M3) when conducting steps 102 and 103, and the other of which is used to replace the contact-hole mask (M4) and the pixel mask (M5) when simultaneously conducting steps 104 and 105.

In current four-photomask or three-photomask processes, the multi-tone mask, aside from the fully transparent region and the non-transparent region, has only one partially transparent region, and is used to replace the single-tone mask. By reducing the numbers of the photomasks and fabricating the TFT substrate using the above-mentioned multi-tone mask (s), an object of cost reduction can be achieved.

Referring to FIG. 10, when a multi-tone mask is used to replace the contact-hole mask (M4) and the pixel mask (M5) in the three-photomask process, the transparent conductive layer 17a is formed on the passivation film 186, the exposed parts of the source and drain electrodes 185a, 185b, and a remaining portion of the photoresist layer 200 that is formed on a portion of the passivation film 186 and between the two contact holes 185c. Thereafter, the pixel electrode layer 17 is formed by removing the remaining portion of the photoresist layer 200 and a part of the transparent conductive layer 17a on the remaining portion of the photoresist layer 200 using a lift-off method. However, the removal of the part of the transparent conductive layer 17a and the photoresist layer 200 using the lift-off method may adversely affect yield of the TFT substrate. Besides, the transparent conductive layer 17a is Insoluble in a photoresist-stripping agent, and thus, a filter used in a device for recycling and supplying the photoresist-stripping agent is likely to be clogged with the removed transparent conductive layer 17a, thereby reducing service life thereof.

SUMMARY OF THE INVENTION

Therefore, an object of the present invention is to provide a method for fabricating a thin film transistor substrate that can overcome the aforesaid drawbacks associated with the prior art.

According to one aspect of this invention, a method for fabricating a thin film transistor substrate comprises:

(a) forming a gate electrode on a substrate using a first photoresist layer;

(b) forming an insulating film, an active semiconductor layer, a doped semiconductor layer, an ohmic contact metal film, a passivation film, and a second photoresist layer on the substrate to cover the gate electrode;

(c) disposing a multi-tone mask over the second photoresist layer, followed by performing a lithography process to form the second photoresist layer into a patterned photoresist, which has different thicknesses at a location corresponding in position to the gate electrode and on two opposite sides of the location; and (d) performing etching using the patterned photoresist so that a portion of each of the passivation film, the ohmic contact metal film, the doped semiconductor layer, the active semiconductor layer, and the insulating film, which is uncovered by the patterned photoresist layer, is etched until the substrate is exposed, so that a channel is formed to expose the active semiconductor layer at the location corresponding to the gate electrode, and so that two contact holes are formed on two opposite sides of the channel to expose parts of the ohmic contact metal layer that form drain and source electrodes.

According to another aspect of this invention, a method for fabricating a thin film transistor substrate comprises:

(a) forming a gate electrode and a lower capacitor electrode on a substrate using a first photoresist layer;

(b) forming an insulating film, an active semiconductor layer, a doped semiconductor layer, an ohmic contact metal film, a passivation film, and a second photoresist layer on the substrate to cover the gate electrode and the lower capacitor electrode;

(c) disposing a multi-tone mask over the second photoresist layer, followed by performing a lithography process to form the second photoresist layer into a patterned photoresist, which has different thicknesses at a location corresponding in position to the gate electrode, on two opposite sides of the location, and at a location corresponding in position to the lower capacitor electrode; and (d) performing etching using the patterned photoresist so that a portion of each of the passivation film, the ohmic contact metal film, the doped semiconductor layer, the active semiconductor layer, and the insulating film, which is uncovered by the patterned photoresist, is etched until the substrate is exposed, so that a part of the passivation film at the location corresponding to the lower capacitor electrode is removed, so that a channel is formed to expose the active semiconductor layer at the location corresponding to the gate electrode, and so that two contact holes are formed on two opposite sides of the channel to expose parts of the ohmic contact metal layer that form drain and source electrodes.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
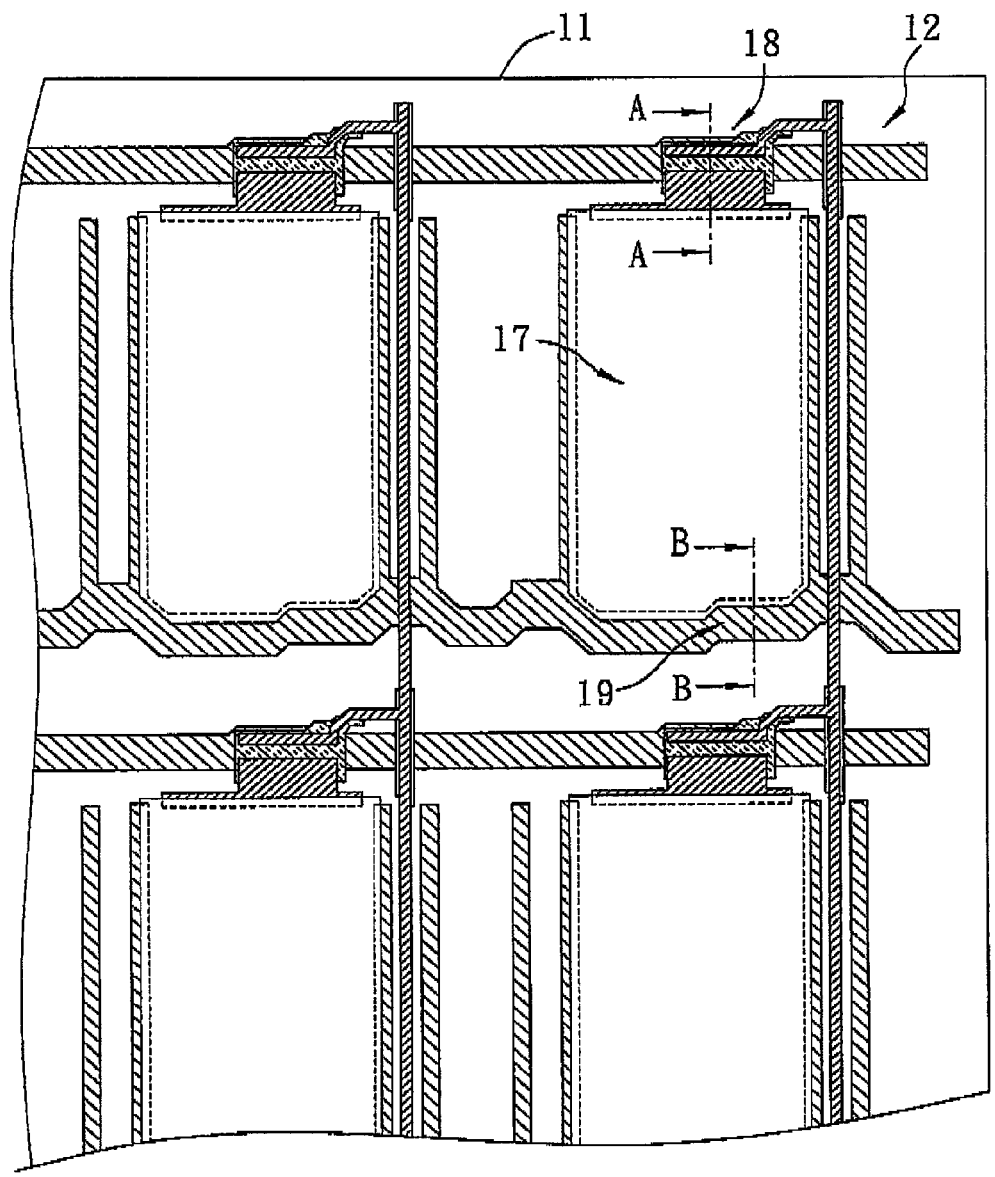
FIG. 1 is a fragmentary top view of a conventional thin film transistor substrate.
Figure 2:
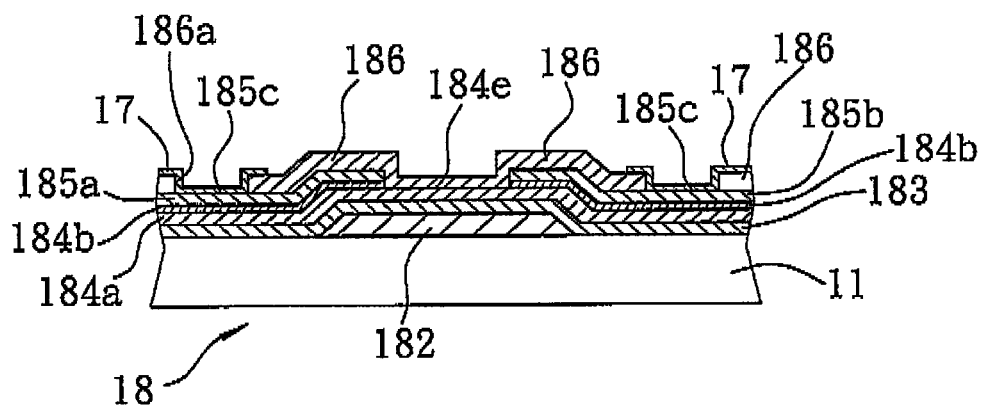
FIG. 2 is a fragmentary cross-sectional view taken along line A-A in FIG. 1.
Figure 3A:
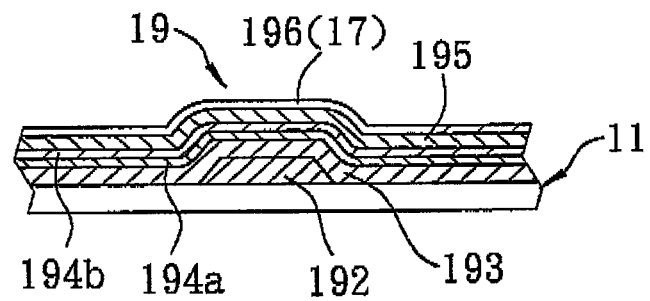
FIG. 3(a) is a fragmentary cross-sectional view taken along line B-B in FIG. 1, in which a storage capacitor in the thin film transistor substrate has a MIS structure.
Figure 3B:
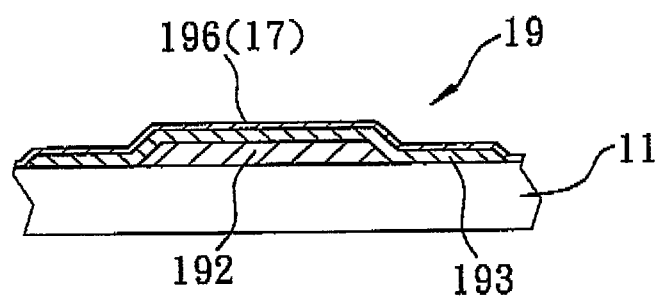
FIG. 3(b) is a fragmentary cross-sectional view taken along line B-B in FIG. 1, in which a storage capacitor in the thin film transistor substrate has a MIM structure.
Figure 4:
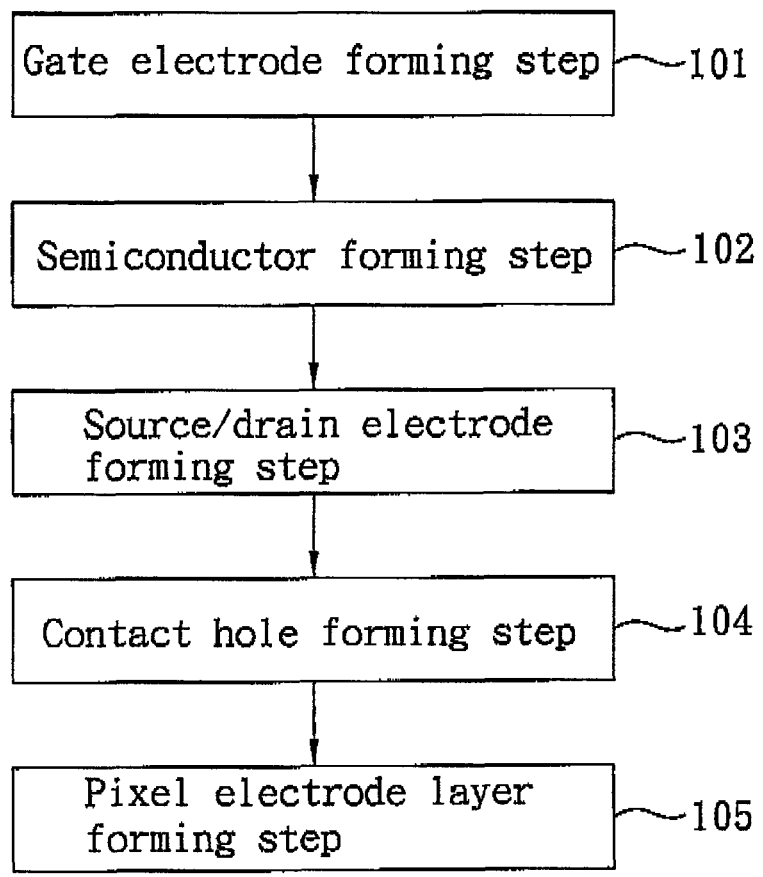
FIG. 4 is a flow chart illustrating a conventional method for fabricating the thin film transistor substrate shown in FIG. 1.
Figure 5:
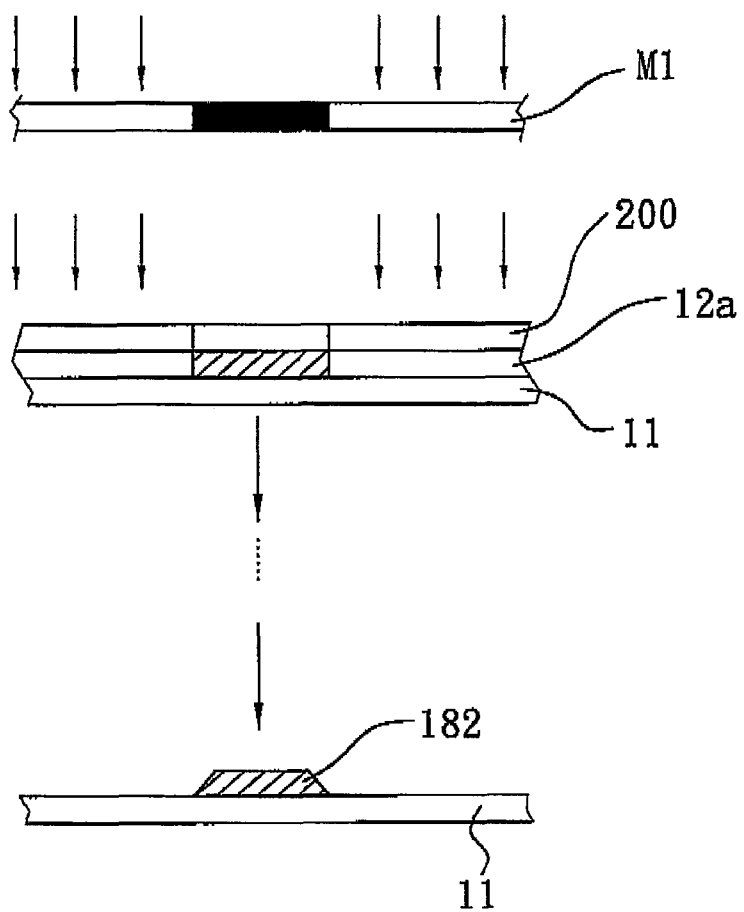
FIG. 5 is a flow diagram illustrating a gate forming step in the conventional method illustrated in FIG. 4.
Figure 6:
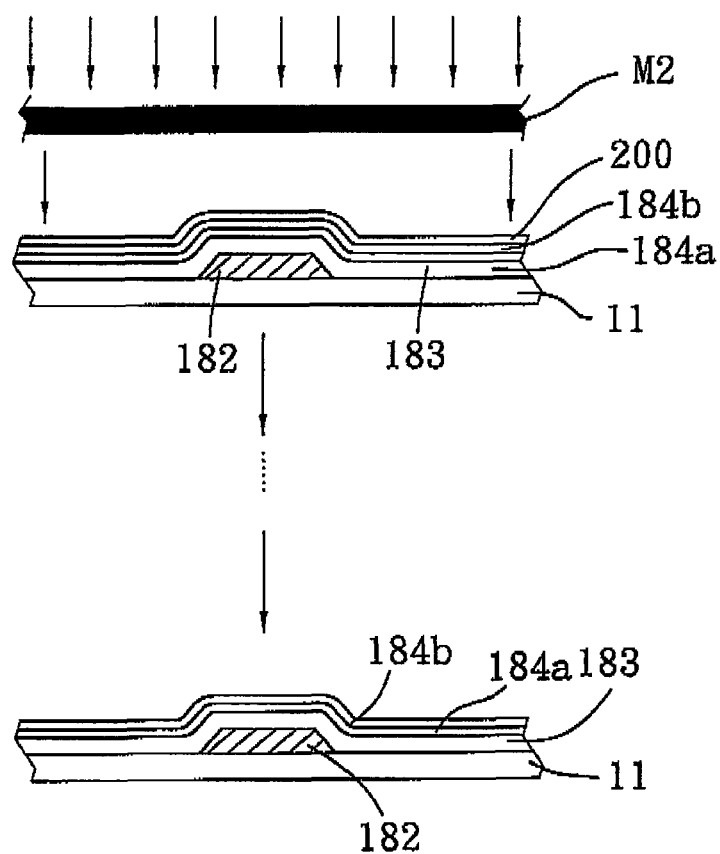
FIG. 6 is a flow diagram illustrating a semiconductor forming step in the conventional method illustrated in FIG. 4.
Figure 7:
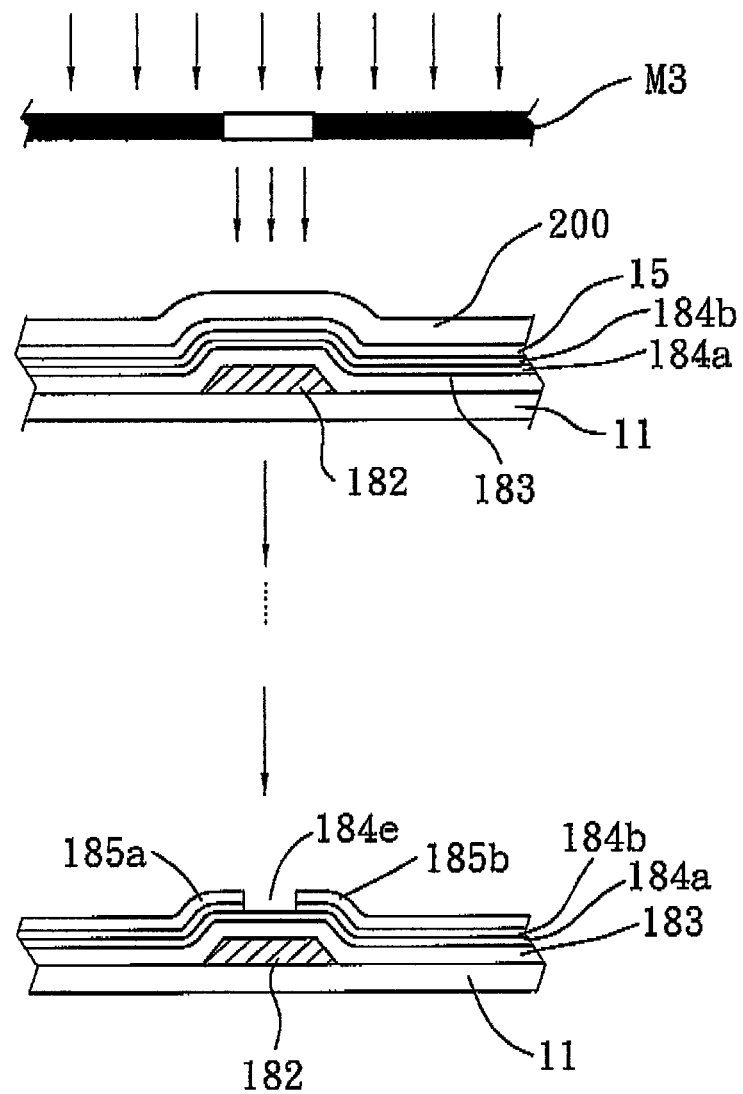
FIG. 7 is a flow diagram illustrating a source/drain electrode forming step in the conventional method illustrated in FIG. 4.
Figure 8:
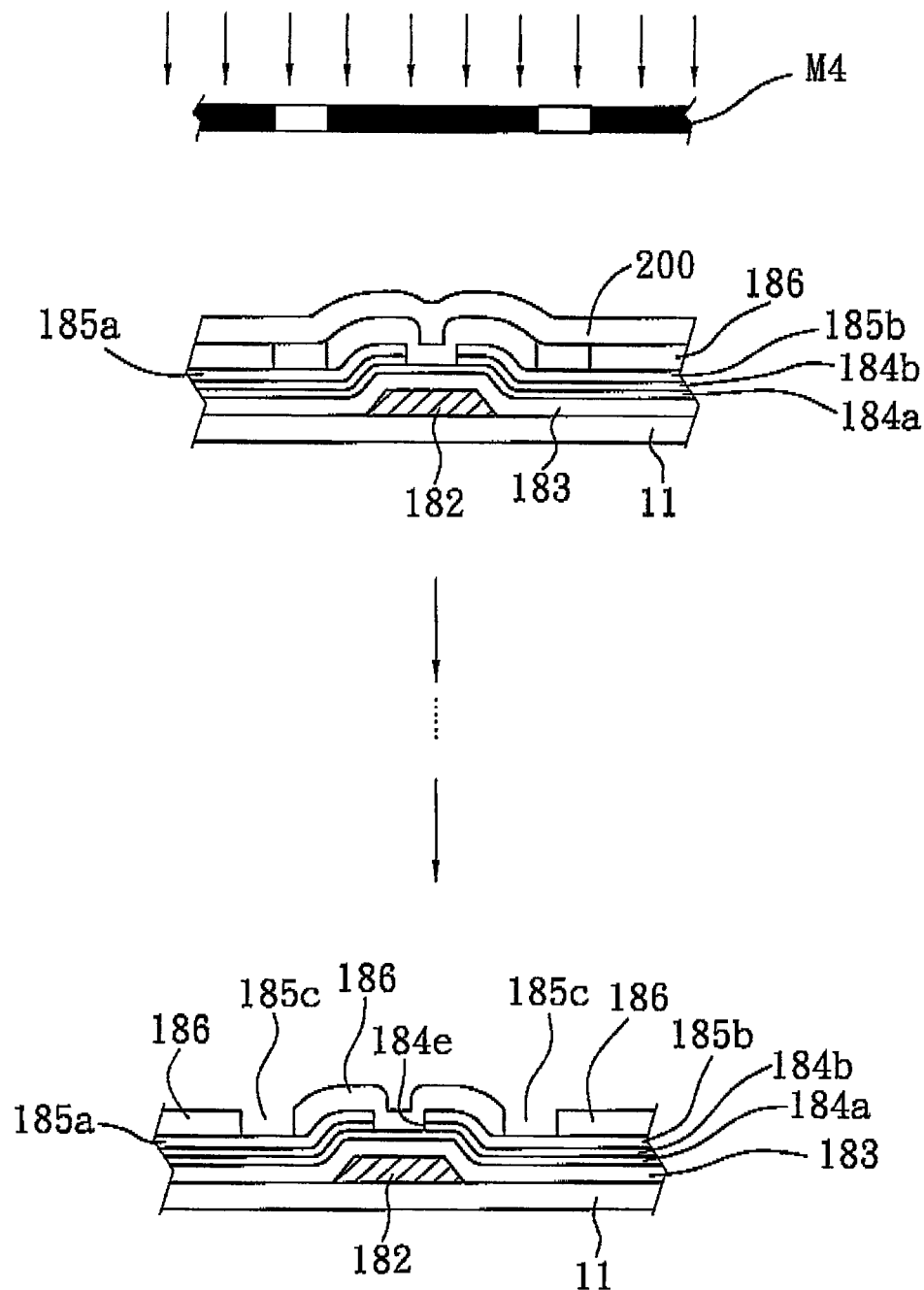
FIG. 8 is a flow diagram illustrating a contact hole forming step in the conventional method illustrated in FIG. 4.
Figure 9:
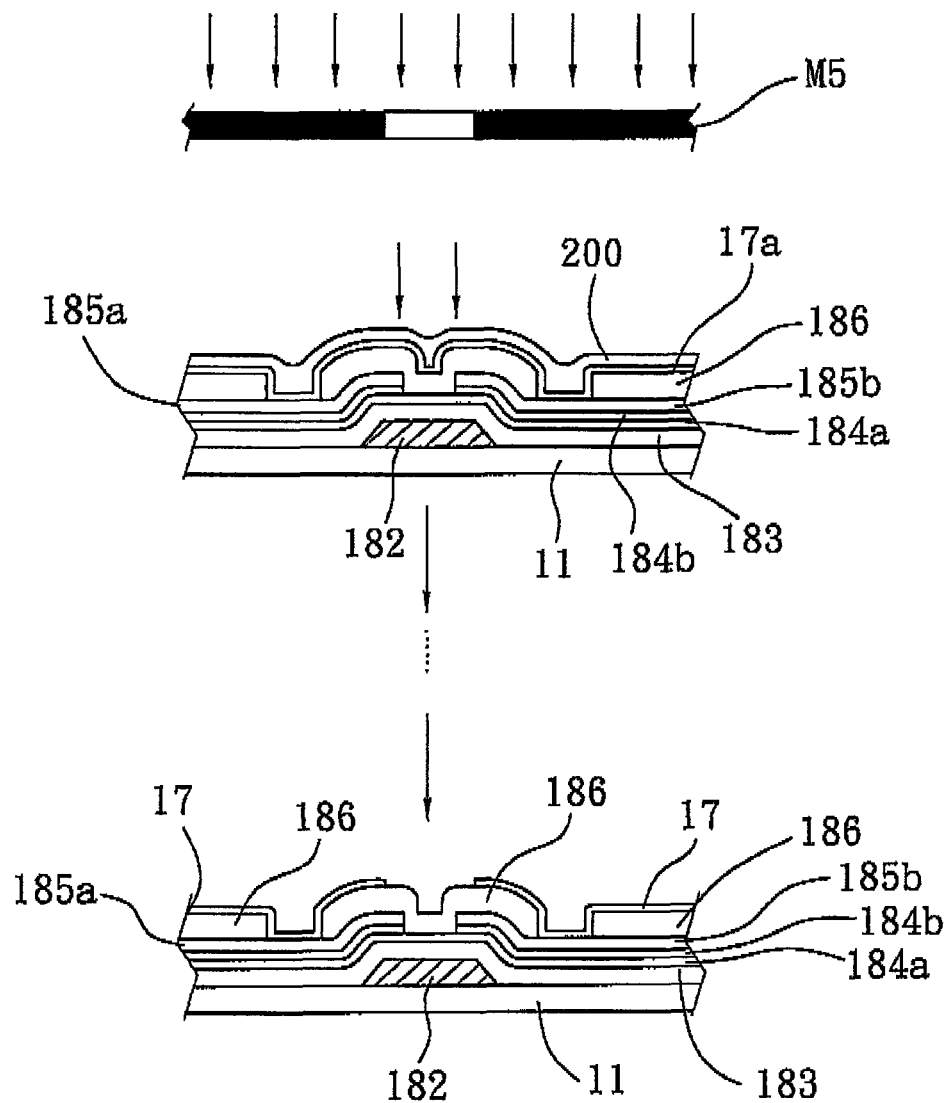
FIG. 9 is a flow diagram illustrating a pixel electrode layer forming step in the conventional method illustrated in FIG. 4.
Figure 10:
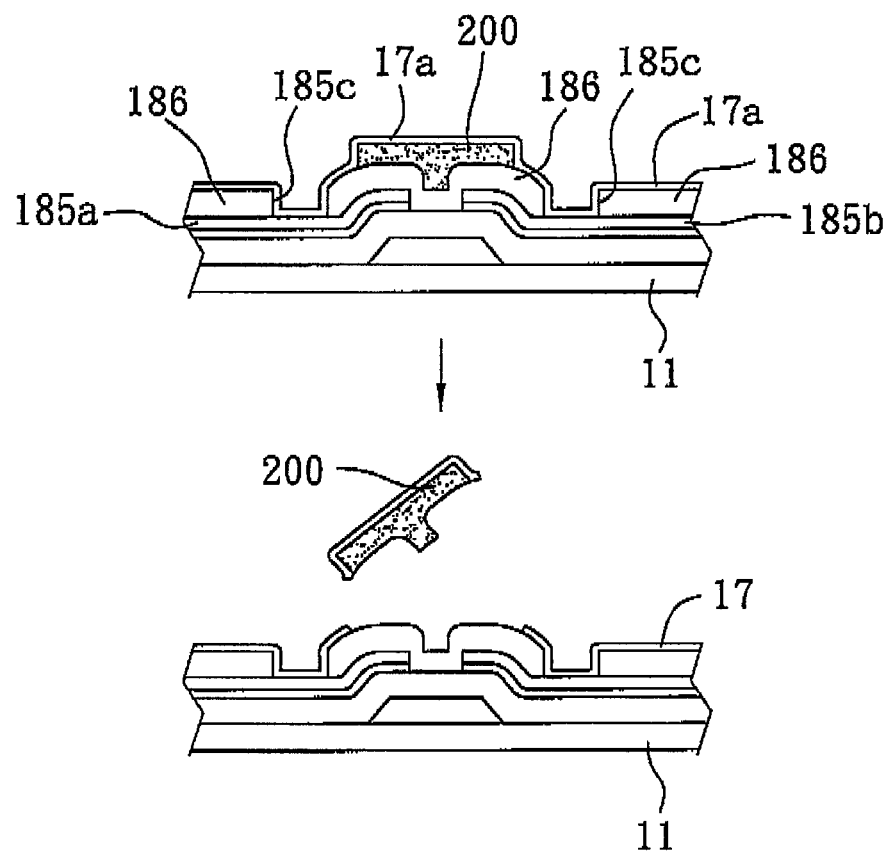
FIG. 10 is a flow diagram illustrating a lift-off step used in a three-photomask process for forming the thin film transistor substrate, in which a multi-tone mask is used.

Before the present invention is described in greater detail with reference to the accompanying preferred embodiments, it should be noted herein that like elements are denoted by the same reference numerals throughout the disclosure.

Figure 11:
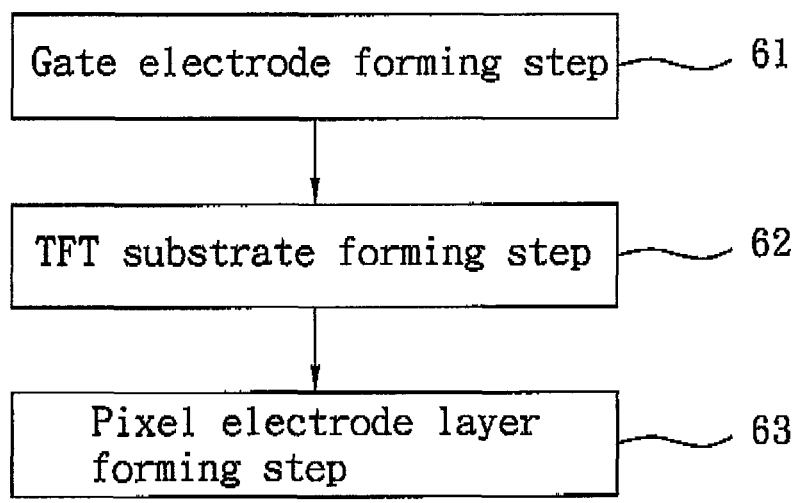
FIG. 11 is a flow chart illustrating the first preferred embodiment of a method for fabricating a thin film transistor substrate according to this invention.
Figure 12:
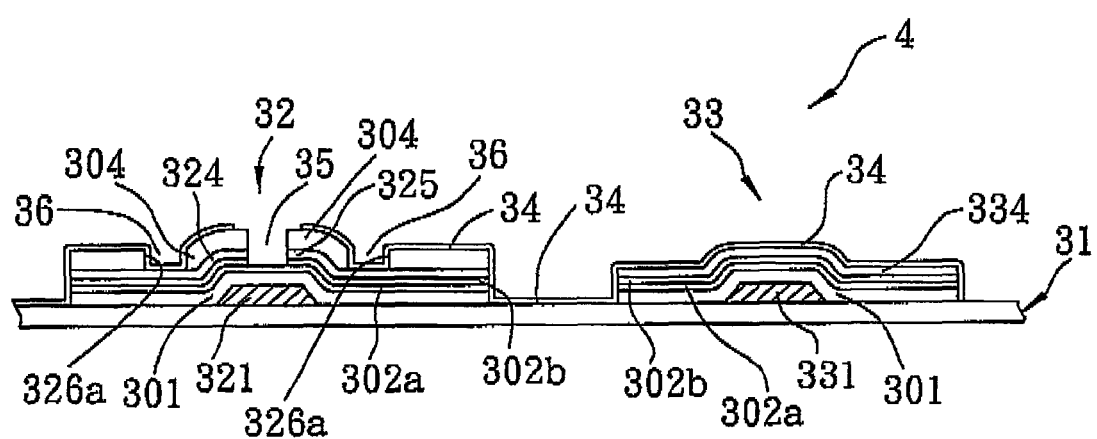
FIG. 12 is a fragmentary partly sectional view of the thin film transistor substrate made according to the first preferred embodiment of this invention.

Referring to FIG. 11, the first preferred embodiment of a method for fabricating a thin film transistor substrate (TFT substrate) of FIG. 12 is shown.

The TFT substrate as shown in FIG. 12 is similar to the conventional ones, and includes a transparent glass substrate 31, hereinafter referred to as "substrate"), and a plurality of pixel units 4 regularly arranged and formed on the substrate 31.

Each of the pixel units 4 includes a thin film transistor structure (TFT structure) 32 formed on the substrate 31, a storage capacitor ($C_{st}$) 33 formed on the substrate 31 and spaced apart from the TFT structure 32, and a pixel electrode layer 34 covering the TFT structure 32 and the storage capacitor 33 to electrically connect the TFT structure 32 to the storage capacitor 33.

The TFT structure 32 includes a gate electrode 321 formed on the substrate 31, an insulating film 301 formed on the substrate 31 to cover the gate electrode 321, an active semiconductor layer 302a formed on the insulating film 301, a doped semiconductor layer 302b formed on the active semiconductor layer 302a and interrupted by a channel 35, source and drain electrodes 324, 325 formed on the doped semiconductor layer 302b and located respectively at two opposite sides of the channel 35, and a passivation film 304 covering the source and drain electrodes 324, 325. The passivation film 304 is formed with two contact holes 36, through which the source and drain electrodes 324, 325 are partially exposed. Each of the contact holes 36 is defined by a recess-defining wall 326a of the passivation film 304.

The storage capacitor 33 of this embodiment has a metal-insulator-semiconductor (MIS) structure, and includes a lower capacitor electrode 331, the insulating film 301 covering the capacitor electrode 331, the active semiconductor layer 302a formed on the insulating film 301, the doped semiconductor layer 302b formed on the active semiconductor layer 302a, and an upper capacitor electrode 334 made of a metal material and formed on the doped semiconductor layer 302b.

The pixel electrode layer 34 covers the passivation film 304, the recess-defining walls 326a, and the source and drain electrodes 324, 325 exposed from the passivation film 304. The pixel electrode layer 34 extends from the drain electrode 325, along a side of the TFT structure 32 that is adjacent to the storage capacitor 33, along a surface of the substrate 31 between the TFT structure 32 and the storage capacitor 33, and covers a top side of the storage capacitor 33, thereby electrically connecting the TFT structure 32 and the storage capacitor 33.

In detail, each of the gate electrode 321 and the lower capacitor electrode 331 has a single-layer structure made of a material selected from Al, Cu, Mo, Ti, Cr, Mon, AlNd, MoTa, MoNb, AlNiHf and combinations thereof. Alternatively, each of the gate electrode 321 and the lower capacitor electrode 331 may have a multi-layer structure, such as a two-layer structure of Mo/AlNd, a three-layer structure of Mo/Al/Mo, etc. The insulating film 301 is made of a material selected from $SiN_x$, $SiO_x$, $SiO_xN_y$, etc. The active semiconductor layer 302a is made of amorphous silicon (a-Si), and is formed on the insulating film 301. The doped semiconductor layer 302b is made of n-type doped amorphous silicon ($n^+$-a-Si). Each of the source electrode 324, the drain electrode 325, and the lower capacitor electrode 334 is made of a material selected from the same materials for forming the gate electrode 321 and may also have a single-layer or multi-layer structure. The passivation film 304 is made of a material selected from the same materials for forming the insulating film 301. The pixel electrode layer 34 is made of a transparent conductive material, such as ITO, AZO, GZO, IZO, CNTs, etc.

The method for fabricating the TFT substrate of this invention is explained in more detail below.

Referring to FIG. 11, the first preferred embodiment of the method for fabricating the TFT substrate of this invention includes a gate electrode forming step 61, a TFT substrate forming step 62, and a pixel electrode layer forming step 63.

Figure 13:
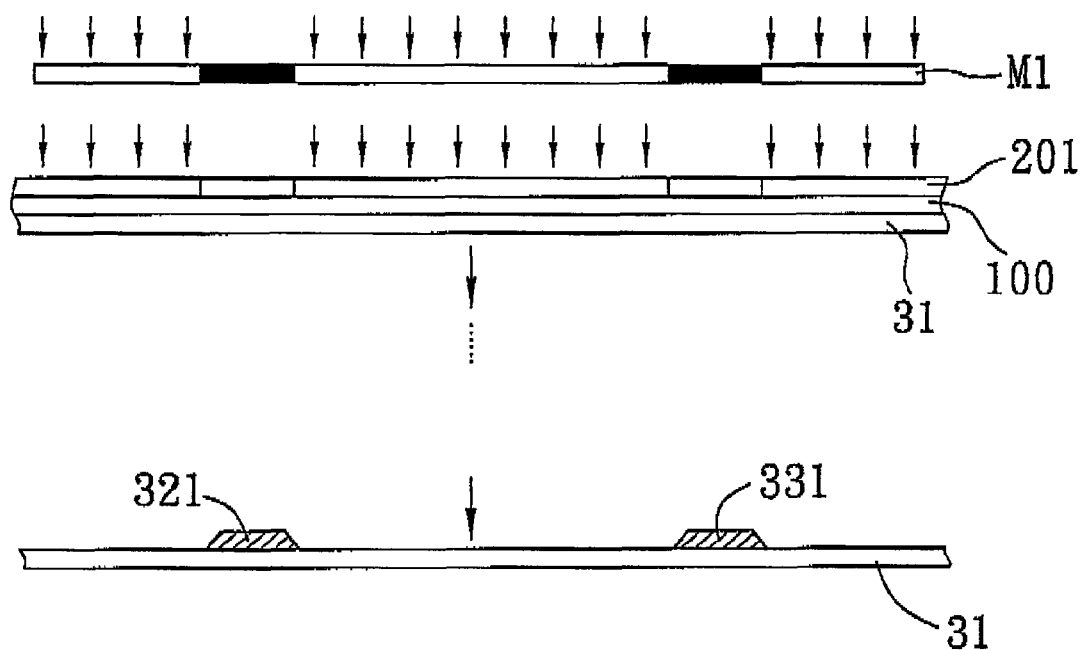
FIG. 13 is a flow diagram illustrating a gate electrode forming step in the method illustrated in FIG. 11.

Referring to FIG. 13, in step 61, a metal film 100 is deposited on the substrate 31, and a lithography process is conducted to form the metal film 100 into a gate electrode 321 and a lower capacitor electrode 331 spaced apart from the gate electrode 321.

In detail, in the lithography process, a first photoresist layer 201 is formed on the metal film 100. The first photoresist layer 201 can be made of a positive-type or negative-type photoresist material. The selection of the materials is well-known in the art, and the detailed descriptions thereof are omitted for the sake of brevity. In this, embodiment, the first photoresist layer 201 is made of the positive-type photoresist material.

Next, the first photoresist layer 201 is patterned using a gate mask (M1) that is single-tone, and the metal layer 100 that is uncovered by the patterned first photoresist layer 201 is wet-etched or dry-etched, followed by removing the patterned first photoresist layer 201 so as to form the gate electrode 321 and the lower capacitor electrode 331.

Figure 14:
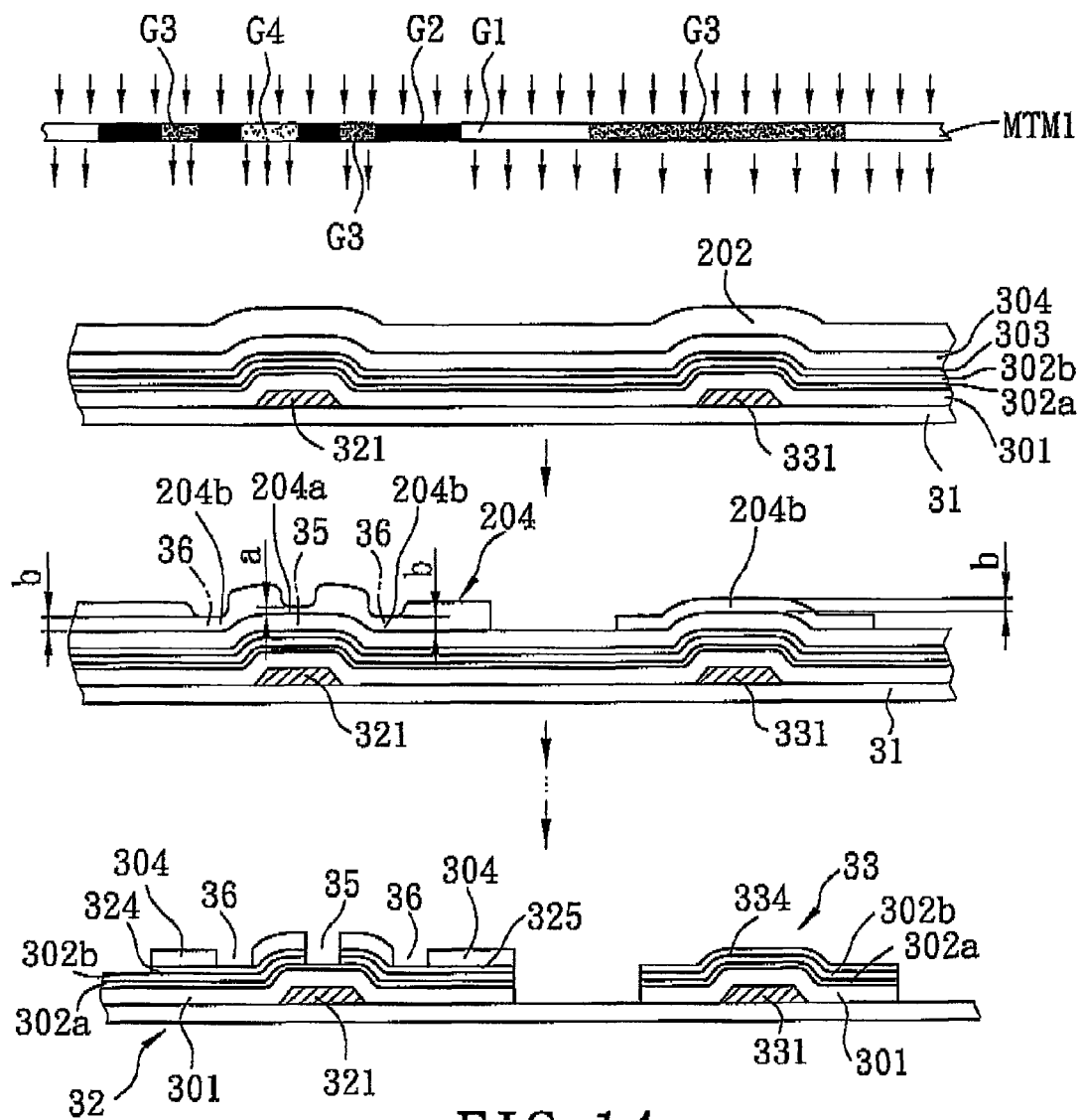
FIG. 14 is a flow diagram illustrating a thin film transistor substrate forming step in the method illustrated in FIG. 11.

Referring to FIG. 14, in step 62, the insulating film 301, the active semiconductor layer 302a, the doped semiconductor layer 302b, an ohmic contact metal film 303, and the passivation film 304 are sequentially formed on the substrate 31 to cover the gate electrode 321 and the lower capacitor electrode 331. In this embodiment, a chemical vapor deposition (CVD) process, for example a plasma enhanced chemical vapor deposition (PECVD) process, is conducted by depositing a silicon nitride film ($SiN_x$) as the insulating film 301, an amorphous silicon (a-Si) film as the active semiconductor layer 302a, and an n-type amorphous silicon ($n^+$-a-Si) film as the doped semiconductor layer 302b. Thereafter, the ohmic contact metal film 303 having a three-layer structure of Mo/Al/Mo is formed on the doped semiconductor layer 302b by sputtering or evaporation. Finally, a silicon nitride film ($SiN_x$) as the passivation film 304 is deposited on the ohmic contact metal film 303 using PECVD.

It should be noted that the insulating film 301, the active semiconductor layer 302a, the doped semiconductor layer 302b, the ohmic contact metal film 303, and the passivation film 304 are formed successively. Thus, apparatuses for forming different layers can be disposed adjacent to each other. For example, the insulating film 301, the active semiconductor layer 302a, the doped semiconductor layer 302b, and the passivation film 304 are formed using PECVD apparatuses. The ohmic contact metal film 303 is formed using a sputtering apparatus. The PECVD apparatuses and the sputtering apparatus can be disposed adjacent to each other. Therefore, the required space for installation of the apparatuses can be optimized.

In step 62, the different layers 301, 302a, 302b, 303, 304 are formed successively, and then, are subjected to a lithography process and an etching process. However, in the conventional method for fabricating the TFT substrate, the layers are not formed successively, and each of the layers is formed followed by being subjected to the lithography and etching processes. The layer structure has to be removed from the apparatus for several times, and thus, to prevent contamination, the same needs to be cleaned before a next step is carried out. Accordingly, compared with the conventional method, the method of this invention has reduced steps, thereby preventing contamination of the product and decreasing transport time.

Preferably, the PECVD and sputtering apparatuses for forming the insulating film 301, the active semiconductor layer 302a, the doped semiconductor layer 302b, the ohmic contact metal film 303, and the passivation film 304 can be disposed adjacent to each other in a row or a circle based on requirements. Alternatively, the PECVD apparatuses for forming the insulating film 301, the active semiconductor layer 302a, and the doped semiconductor layer 302b can be integrated into a first apparatus, and the sputtering apparatuses for forming the three-layer structure of Mo/Al/Mo of the ohmic contact metal film 303 can be also integrated into a second apparatus and disposed adjacent to the first apparatus. In this case, the required space for installation of the apparatuses and the transport time can be further reduced.

Next, a second photoresist layer 202 is formed on the passivation film 304, and a multi-tone mask (MTM1) is disposed over the second photoresist layer 202, followed by performing a lithography process to form the second photoresist layer 202 into a patterned photoresist 204.

The multi-tone mask (MTM1) may be a half-tone mask or a gray-tone mask, and is formed with a plurality regions each of which has different light transmittance and may be a gray tone pattern or a slit pattern. When light passes through the half-tone mask with different light-transmittances, the second photoresist layer 202 disposed below the half-tone mask is exposed to different exposure degrees based on the regions of the half-tone mask, thereby forming the patterned photoresist 204 having different thicknesses. The gray-tone mask has a plurality of grating microstructures on a transparent substrate. Each of the grating microstructures has a different space width. When light passes through the gray-tone mask, the light is interfered and diffracted by the grating microstructures, and the second photoresist layer 202 disposed below the gray-tone mask is exposed to different exposure degrees based on the grating microstructures of the gray-tone mask, thereby forming the patterned photoresist 204 having different thicknesses.

In this embodiment, the multi-tone mask is exemplified using the half-tone mask. With the half-tone mask, the patterned photoresist 204 is formed to have different thicknesses. The half-tone mask (i.e., the multi-tone mask (MTM1) shown in FIG. 14) has a fully transparent region (G1), a non-transparent region (G2), a first partially exposed region (G3) that is disposed at a position corresponding to the lower capacitor electrode 331 and the two contact holes 36, and a second partially exposed region (G4) that is disposed at a position corresponding to the gate electrode 321. The first partially exposed region (G3) has a light-transmittance lower than that of the second partially exposed region (G4). Thus, the patterned photoresist 204 has different thicknesses at a location corresponding in position to the gate electrode 321 and on two opposite sides of the location (i.e., corresponding in position to the contact holes 36). In detail, the patterned photoresist 204 has a minimum thickness (a) at a first region 204a corresponding in position to the channel 35, and a thickness (b) at a second region 204b corresponding in position to the two contact holes 36 and to the lower capacitor electrode 331. Moreover, the region of the second photoresist layer 202 corresponding in position to the fully transparent region (G1) of the half-tone mask (MTM1) is completely removed so that a portion of each of the passivation film 304, the ohmic contact metal film 303, the doped semiconductor layer 302b, the active semiconductor layer 302a, and the insulating film 301, is uncovered by the patterned photoresist 204.

By wet-etching and/or dry-etching, the portion of each of the passivation film 304, the ohmic contact metal film 303, the doped semiconductor layer 302b, the active semiconductor layer 302a, and the insulating film 301, which is uncovered by the patterned photoresist 204, is etched until the substrate 31 is exposed. In detail, the portion of each of the passivation film 304, the ohmic contact metal film 303, the doped semiconductor layer 302b, the active semiconductor layer 302a, and the insulating film 301, which is disposed at a location between the positions where the TFT structure 32 and the storage capacitor ($C_{st}$) 33 are to be formed, is removed, thereby separating the TFT structure 32 from the storage capacitor ($C_{st}$) 33. Thereafter, by using multiple etching procedures, a part of the passivation film 304 at the location corresponding to the lower capacitor electrode 331 is removed to expose a part of the ohmic contact metal layer 303 that forms the upper capacitor electrode 334. The channel 35 is formed to expose the active semiconductor layer 302a at the location corresponding to the gate electrode 321. The two contact holes 36 are formed on the two opposite sides of the channel 35 to expose parts of the ohmic contact metal layer 303 that form the source and drain electrodes 324, 325.

In the multiple etching procedures, the first portion 204a of the patterned photoresist 204 is removed via an ashing process to expose the passivation film 304 corresponding in position to the first portion 204a, followed by etching, e.g., dry or wet etching, the exposed passivation film 304 until the active semiconductor layer 302a is exposed. At this moment, the channel 35 is formed to interrupt the ohmic contact metal layer 303 and to form the ohmic contact metal layer 303 into the source and drain electrodes 324, 325.

Thereafter, the second region 204b is removed via another ashing process to expose the passivation film 304 corresponding in position to the second portion 204b, followed by etching, e.g., dry etching, the exposed passivation film 304 until the source electrode 324, the drain electrode 325, and the part of the ohmic contact metal film 303 as the upper capacitor electrode 334 are exposed. At this time, the two contact holes 36 are formed. After removing the remaining part of the patterned photoresist 204, the TFT structure 32 containing the gate electrode 321, and the storage capacitor 33 containing the lower capacitor electrode 331 are obtained.

Next, in order to prevent a short circuit, an isolation treatment is conducted to form insulating barriers on sidewalls of the TFT structure 32 and the storage capacitor 33 that expose the active semiconductor layer 302a and the doped semiconductor layer 302b. The isolation treatment may include an oxynitridation process, or may further include a process of PSG, BSG, or BPSG. Thereafter, a reflow process is further performed to obtain the insulating barriers. Since the processes for the isolation treatment are well-known in the art, the detailed descriptions thereof are omitted for the sake of brevity. In this embodiment, the oxynitridation process is used to form $SiO_xN_y$ films as the insulating barriers.

Figure 15:
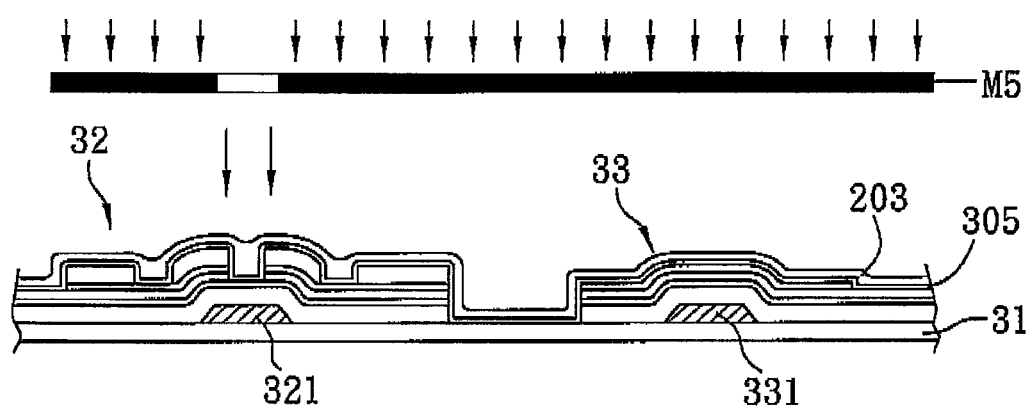
FIG. 15 is a flow diagram illustrating a pixel electrode layer forming step in the method illustrated in FIG. 11.

Referring FIG. 15, in step 63, the pixel electrode layer 34 is formed to cover the TFT structure 32 and the storage capacitor 33 using a transparent conductive layer 305.

In detail, step 63 is conducted by: (1) sputtering or vapor-depositing a transparent conductive film of ITO, AZO, IZO, GZO, CNTs and so on over the TFT structure 32 and the storage capacitor 33 to form the transparent conductive layer 305 that has an amorphous structure; (2) forming a third photoresist layer 203 on the transparent conductive layer 305; (3) performing a lithography process using a pixel electrode layer mask (M5) so that the third photoresist layer 203 is patterned; (4) removing a portion of the transparent conductive layer 305 exposed from the patterned third photoresist layer 203 using an etching process to form the pixel electrode layer 34; (5) removing the patterned third photoresist layer 203; and (6) annealing the pixel electrode layer 34 so that the pixel electrode layer 34 has a crystalline structure.

In this embodiment, step 63 is conducted by: (1) sputtering the transparent conductive layer 305, which has an amorphous structure made of ITO, over the TEST structure 32 and the storage capacitor 33; (2) forming a third photoresist layer 203 on the transparent conductive layer 305; (3) performing a lithography process using the conventional pixel electrode layer mask (M5) so that the third photoresist layer 203 is patterned; (4) removing a portion of the transparent conductive layer 305, which is exposed from the patterned third photoresist layer 203 and is formed in the channel 35 and on the passivation film 304 in the vicinity of the channel 35, using a wet-etching process to form the pixel electrode layer 34; (5) removing the patterned third photoresist layer 203 using an etching process; and (6) annealing the pixel electrode layer 34 under an activation temperature which is adapted for annealing ITO and is not adverse to other material layers, so that the amorphous structure of the pixel electrode layer 34 is formed into a crystalline structure. Accordingly, the TFT substrate as shown in FIG. 12 is obtained.

Alternatively, the lithography and annealing processes in step 63 can be replaced by a laser annealing process. In the laser annealing process, the transparent conductive layer 305 is masked by a mask (not shown) and subjected to laser annealing through the mask to partially form the transparent conductive layer 305 into a polycrystalline structure that constitutes the pixel electrode layer 34. Thereafter, because the amorphous and polycrystalline structures have different solubility properties, a remaining portion of the amorphous structure can be removed from the pixel electrode layer 34 using an etching process. Specifically, in the laser annealing process, the transparent conductive layer 305 having an amorphous structure and made of a transparent conductive material of ITO, AZO, IZO, GZO, CNTs, etc, is formed over the TFT structure 32 and the storage capacitor 33. The transparent conductive layer 305 exposed from the mask is irradiated by a laser beam having an energy density of 50~200 mJ/cm$^2$, so that an irradiated portion of the transparent conductive layer 305 is formed into a polycrystalline structure. Thereafter, a non-irradiated portion of the transparent conductive layer 305, which is still amorphous, is removed using an etchant, for example, an oxalic acid etchant. The irradiated portion of the transparent conductive layer 305 forms the pixel electrode layer 34.

In other preferred embodiments, a laser removing process is used to replace the lithography and annealing processes in step 63. In the laser removing process, the transparent conductive layer 305 is directly and partially removed by introducing a laser beam through another mask (not shown), thereby forming the pixel electrode layer 34.

In step 63, no matter how the pixel electrode layer 34 is formed by the conventional lithography process or the laser annealing process, the removed part of the transparent conductive layer 305 is amorphous, and thus, can be dissolved in the etchant (for example, the oxalic acid etchant). Therefore, with the method for fabricating the TFT substrate according to this invention, the drawbacks associated with the conventional lift-off process for forming the pixel electrode layer, such as the problems of inferior yield and clogging, can be overcome, and the yield of the TFT substrate made according to the method of this invention can be efficiently improved.

Figure 16:
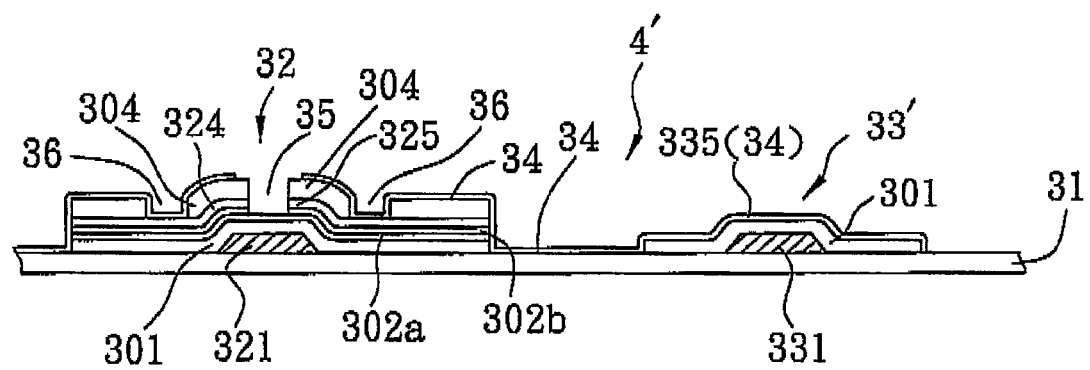
FIG. 16 is a schematic view of the thin film transistor substrate made according to the second preferred embodiment of a method for fabricating a thin film transistor substrate of this invention.

FIG. 16 shows a TFT substrate made according to the second preferred embodiment of a method for fabricating the TFT substrate of this invention.

The TFT substrates in the first and second preferred embodiments of this invention are similar (see FIGS. 12 and 16). As shown in FIG. 16, in the second preferred embodiment, the TFT substrate includes a transparent glass substrate 31 (hereinafter referred as "substrate") and a plurality of pixel units 4' regularly arranged and formed on the substrate 31. Each of the pixel units 4' includes a TFT structure 32, a storage capacitor 33' and a pixel electrode layer 39. In the second preferred embodiment, the storage capacitor 33' is different from the storage capacitor 33 of the first preferred embodiment, and has a metal-insulator-metal (MIM) structure which includes a lower capacitor electrode 331 formed on the substrate 31, an insulating film 301, and an upper capacitor electrode 335 constituted by the pixel electrode layer 34 that covers the insulating film 301.

In the first and second preferred embodiments of this invention, the methods for fabricating the TFT substrate are similar except for the TFT substrate forming step 62.

Figure 17:
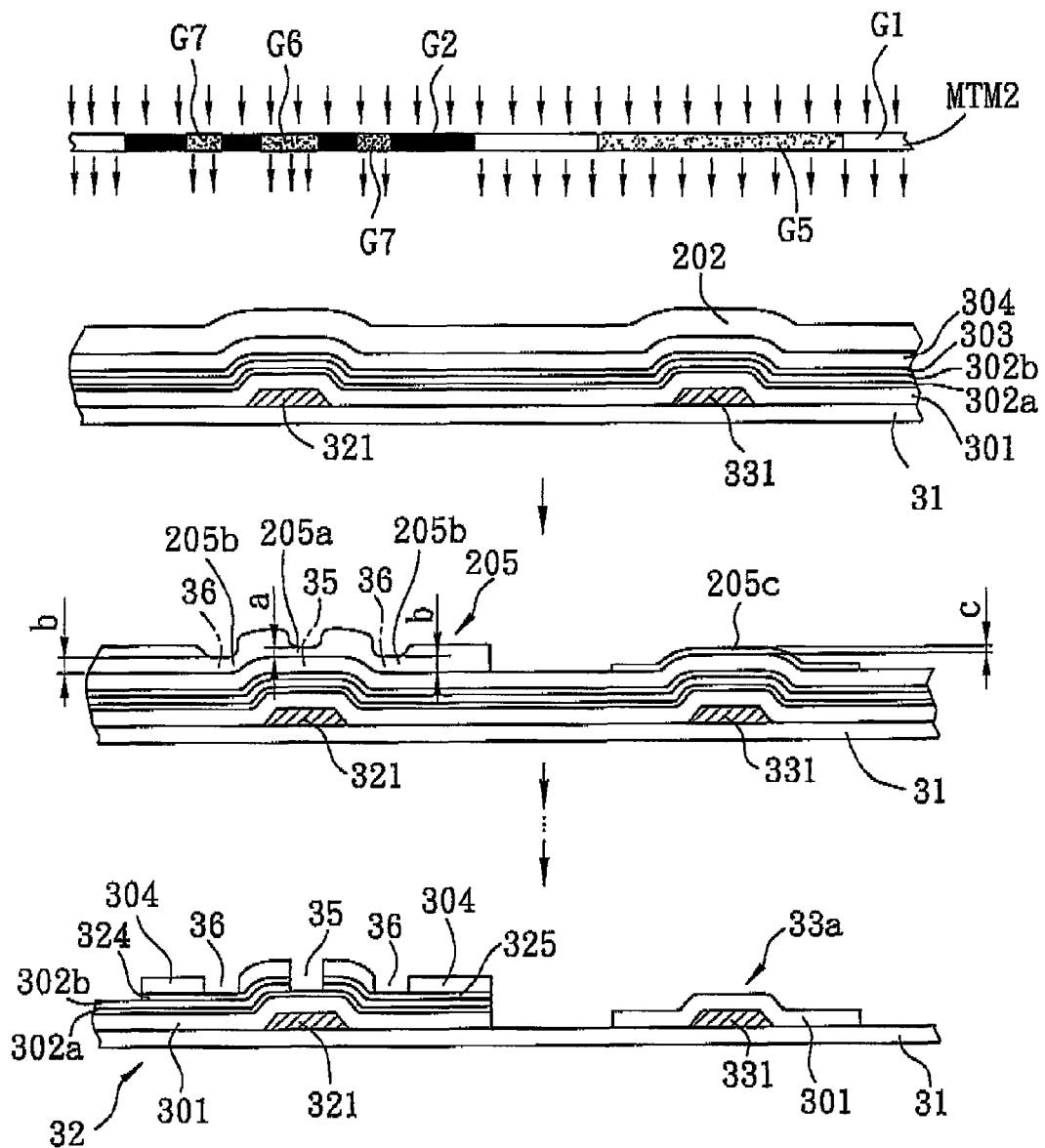
FIG. 17 is a flow diagram illustrating a thin film transistor substrate forming step in the second preferred embodiment of the method according to this invention.

Referring to FIG. 17, in step 62 of the second preferred embodiment, the multi-tone mask (MTM1) is replaced by a multi-tone mask (MTM2), and the multi-tone mask (MTM2) is also exemplified using a half-tone mask. The multi-tone mask (MTM2) differs from the multi-tone mask (MTM1) in that the multi-tone mask (MTM2) has a fully transparent region (G1), a non-transparent region (G2), a first partially exposed region (G5) that is disposed at a location corresponding to the lower capacitor electrode 331, a second partially exposed region (G6) that is disposed at a location corresponding to the gate electrode 321, i.e., also corresponding to the channel 35, and a third partially exposed region (G7) that is disposed on two opposite sides of the location corresponding to the gate electrode 321. Relationships among the light-transmittances of the first, second, and third partially exposed regions (G5, G6, G7) are as follows: G5>G6>G7. Hence, after the second photoresist layer 202 is patterned using the multi-tone mask (MTM2), a patterned photoresist 205 is formed to have different thicknesses based on the different light-transmittances of the multi-tone mask (MTM2). In detail, the patterned photoresist 205 has a first thickness (a) at a first region 205a corresponding in position to the channel 35, a second thickness (b) at a second region 205b corresponding in position to the two contact holes 36, and a third thickness (c) at a third region 205c corresponding in position to the lower capacitor electrode 331. Relationships among the first, second, and third thicknesses (a, b, c) are b>a>c.

After removing the portions that are uncovered by the patterned photoresist 205, the multiple etching procedures are conducted. When conducting the multiple etching procedures, the third region 205c of the patterned photoresist 205 is firstly removed, and a part of each of the passivation film 304, the ohmic contact metal film 303, the doped semiconductor layer 302b and the active semiconductor layer 302a at the location corresponding to the lower capacitor electrode 331 is etched until the insulating film 301 is exposed. Thereafter, the channel 35 and the two contact holes 36 are formed according to the procedures illustrated in the first preferred embodiment of the method of this invention. After removing the patterned photoresist 205, an insulating film (not shown) made of $SiO_xN_y$ is formed to cover a channel-defining wall of the channel 35. At this moment, the TFT structure 32 and a dielectric structure 33a that has the lower capacitor electrode 331 and the insulating film 301 are formed on the substrate 31. The pixel electrode layer forming step 63 is then conducted so as to form the TFT substrate as shown in FIG. 16.

By using the multi-tone mask (MTM1 or MTM2), which has at least two partially transparent regions with different light-transmittances, the conventional five-photomask process for fabricating the TFT substrate can be reduced to a three-photomask process. When forming the pixel electrode layer 34 using the laser process, only two photomasks are required. Thus, the TFT substrate made according to the method of this invention can be formed in a simplified process at a reduced cost. Besides, since the lift-off process is not used in the method of this invention, the drawbacks associated with the lift-off process are eliminated.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for fabricating a thin film transistor substrate, comprising:
    (a) forming a gate electrode on a substrate using a first photoresist layer;
    (b) forming an insulating film, an active semiconductor layer, a doped semiconductor layer, an ohmic contact metal film, a passivation film, and a second photoresist layer on the substrate to cover the gate electrode;
    (c) disposing a multi-tone mask over the second photoresist layer, followed by performing a lithography process to form the second photoresist layer into a patterned photoresist, which has different thicknesses at a location corresponding in position to the gate electrode and on two opposite sides of the location; and
    (d) performing etching using the patterned photoresist so that a portion of each of the passivation film, the ohmic contact metal film, the doped semiconductor layer, the active semiconductor layer, and the insulating film, which is uncovered by the patterned photoresist, is etched until the substrate is exposed, so that a channel is formed to expose the active semiconductor layer at the location corresponding to the gate electrode, and so that two contact holes are formed on two opposite sides of the channel to expose parts of the ohmic contact metal layer that form drain and source electrodes.

2. The method of claim 1, wherein the multi-tone mask includes a fully transparent region, a non-transparent region, and at least two partially transparent regions that have different light-transmittances.

3. The method of claim 1, wherein the insulating film, the active semiconductor layer, the doped semiconductor layer, and the passivation film are formed by chemical deposition, and the ohmic contact metal film is formed by sputtering, apparatuses for chemical deposition and sputtering being disposed adjacent to each other.

4. The method of claim 1, further comprising:
    (e) after the step (d), removing the patterned photoresist, followed by forming a pixel electrode layer on the drain and source electrodes using a transparent conductive layer.

5. The method of claim 4, wherein the transparent conductive layer has an amorphous structure, and is patterned to form the pixel electrode layer using a third photoresist layer, followed by annealing the pixel electrode layer.

6. The method of claim 4, wherein the transparent conductive layer has an amorphous structure, and the transparent conductive layer is masked and subjected to laser annealing to partially form the transparent conductive layer into a polycrystalline structure that constitutes the pixel electrode layer, followed by etching a remaining portion of the amorphous structure.

7. The method of claim 4, wherein the transparent conductive layer has an amorphous structure, and is masked and partially removed using laser to form the pixel electrode layer.

8. A method for fabricating a thin film transistor substrate, comprising:
    (a) forming a gate electrode and a lower capacitor electrode on a substrate using a first photoresist layer;
    (b) forming an insulating film, an active semiconductor layer, a doped semiconductor layer, an ohmic contact metal film, a passivation film, and a second photoresist layer on the substrate to cover the gate electrode and the lower capacitor electrode;
    (c) disposing a multi-tone mask over the second photoresist layer, followed by performing a lithography process to form the second photoresist layer into a patterned photoresist, which has different thicknesses at a location corresponding in position to the gate electrode, on two opposite sides of the location, and a location corresponding in position to the lower capacitor electrode; and
    (d) performing etching using the patterned photoresist so that a portion of each of the passivation film, the ohmic contact metal film, the doped semiconductor layer, the active semiconductor layer, and the insulating film, which is uncovered by the patterned photoresist, is etched until the substrate is exposed, so that a part of the passivation film at the location corresponding to the lower capacitor electrode is removed, so that a channel is formed to expose the active semiconductor layer at the location corresponding to the gate electrode, and so that two contact holes are formed on two opposite sides of the channel to expose parts of the ohmic contact metal layer that form drain and source electrodes.

9. The method of claim 8, wherein the insulating film, the active semiconductor layer, the doped semiconductor layer, and the passivation film are formed by chemical deposition, and the ohmic contact metal film is formed by sputtering, apparatuses for chemical deposition and sputtering being disposed adjacent to each other.

10. The method of claim 8, further comprising:
    (e) after the step (d), removing the patterned photoresist, followed by forming a pixel electrode layer on the drain and source electrodes using a transparent conductive layer.

11. The method of claim 10, wherein the transparent conductive layer has an amorphous structure, and is patterned to form the pixel electrode layer using a third photoresist layer, followed by annealing the pixel electrode layer.

12. The method of claim 10, wherein the transparent conductive layer has an amorphous structure, and the transparent conductive layer is masked and subjected to laser annealing to partially form the transparent conductive layer into a polycrystalline structure that constitutes the pixel electrode layer, followed by etching a remaining portion of the amorphous structure.

13. The method of claim 10, wherein the transparent conductive layer has an amorphous structure, and is masked and partially removed using laser to form the pixel electrode layer.

14. The method of claim 8, wherein the thickness of the patterned photoresist on two opposite sides of the location corresponding to the gate electrode is the same as the thickness of the patterned photoresist at a location corresponding in position to the lower capacitor electrode.

15. The method of claim 14, wherein the multi-tone mask includes a fully transparent region, a non-transparent region, and at least two partially transparent regions that have different light-transmittances, the patterned photoresist having a minimum thickness at a region corresponding in position to the channel.

16. The method of claim 15, wherein the part of the passivation film at the location corresponding to the lower capacitor electrode is removed while other parts of the passivation film are being removed on the two opposite sides of the channel to form the contact holes.

17. The method of claim 8, wherein the patterned photoresist has a minimum thickness at the location corresponding in position to the lower capacitor electrode.

18. The method of claim 17, wherein the multi-tone mask includes a fully transparent region, a non-transparent region, and at least three partially transparent regions that have different light-transmittances.

19. The method of claim 18, wherein, after a part of the patterned photoresist at the location corresponding to the lower capacitor electrode is removed, a part of each of the passivation film, the ohmic contact metal film, the doped semiconductor layer and the active semiconductor layer at the location corresponding to the lower capacitor electrode is etched until the insulating film is exposed.

* * * * *